(12) United States Patent
Hasegawa et al.

(10) Patent No.: US 11,181,589 B2
(45) Date of Patent: Nov. 23, 2021

(54) SEMICONDUCTOR DEVICE

(71) Applicant: DENSO CORPORATION, Kariya (JP)

(72) Inventors: Junichi Hasegawa, Kariya (JP);
Yusuke Michishita, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/943,145

(22) Filed: Jul. 30, 2020

(65) Prior Publication Data
US 2020/0355752 A1 Nov. 12, 2020

Related U.S. Application Data

(63) Continuation of application No. PCT/JP2019/007053, filed on Feb. 25, 2019.

(30) Foreign Application Priority Data

Apr. 26, 2018 (JP) .............................. JP2018-085180

(51) Int. Cl.
| | | |
|---|---|---|
| *G01R 31/62* | (2020.01) | |
| *G01R 31/28* | (2006.01) | |
| *H01L 23/31* | (2006.01) | |
| *H01L 23/495* | (2006.01) | |
| *H01L 23/64* | (2006.01) | |

(52) U.S. Cl.
CPC ......... *G01R 31/62* (2020.01); *G01R 31/2884* (2013.01); *H01L 23/3107* (2013.01); *H01L 23/4952* (2013.01); *H01L 23/49503* (2013.01); *H01L 23/49575* (2013.01); *H01L 23/645* (2013.01)

(58) Field of Classification Search
CPC ................ G01R 31/62; G01R 31/2884; G01R 31/2856; H01L 23/3107; H01L 23/49503; H01L 23/4952; H01L 23/49575; H01L 23/645; H01L 2224/73265; H01L 24/48; H01L 24/49; H01L 24/32; H01L 2224/32245; H01L 2224/48195; H01L 2224/49176; H01L 25/072; H01L 25/18; H01L 2224/48137; H01L 2224/48091; H01L 2924/181; H01L 2224/48247
USPC ...................................... 324/750.3, 537, 500
See application file for complete search history.

(56) References Cited

U.S. PATENT DOCUMENTS

| | | |
|---|---|---|
| 2011/0201271 A1 | 8/2011 | Kuroda |
| 2017/0194959 A1 | 7/2017 | Yanagishima et al. |
| | | (Continued) |

FOREIGN PATENT DOCUMENTS

| | | |
|---|---|---|
| JP | 3624717 B2 | 4/2000 |
| JP | 4710443 B2 | 1/2007 |
| WO | 2010/119625 A1 | 10/2010 |

*Primary Examiner* — Giovanni Astacio-Oquendo
(74) *Attorney, Agent, or Firm* — Posz Law Group, PLC

(57) ABSTRACT

A semiconductor device includes: a signal input circuit that receives a signal from an outside; a signal output circuit that outputs the signal to the outside; a coupling element connected between the signal input circuit and the signal output circuit; an inspection output circuit that causes the signal input circuit to output an inspection signal to the outside not via the coupling element or an inspection input circuit that causes the signal output circuit to receive the inspection signal from the outside not via the coupling element. The signal input circuit, the signal output circuit, and the coupling element are formed on a semiconductor chip and packaged.

10 Claims, 12 Drawing Sheets

(56) References Cited

U.S. PATENT DOCUMENTS

2017/0330810 A1* 11/2017 Joko .................... H01L 23/293
2017/0350933 A1    12/2017 Uematsu et al.
2018/0197950 A1     7/2018 Natsume et al.
2019/0043910 A1*    2/2019 Miyazawa ........ H01L 27/14636
2020/0273802 A1*    8/2020 Otremba ............. H01L 23/5386

* cited by examiner

SEMICONDUCTOR DEVICE

CROSS REFERENCE TO RELATED APPLICATIONS

The present application is a continuation application of International Patent Application No. PCT/JP2019/007053 filed on Feb. 25, 2019, which designated the U.S. and claims the benefit of priority from Japanese Patent Application No. 2018-085180 filed on Apr. 26, 2018. The entire disclosures of all of the above applications are incorporated herein by reference.

TECHNICAL FIELD

The present disclosure relates to a semiconductor device that includes a signal input circuit, a signal output circuit, and a coupling element connected between them.

BACKGROUND

For example, in a multi-chip module, a semiconductor device capable of inspecting a test of a connection state of a power source, a ground, a signal bump, or the like in a product operating state has been proposed as a comparative example. As the semiconductor device of such a multi-chip module, there is a magnetic coupler that includes, for example, a signal input circuit, a signal output circuit, and a coupling element connected between them. The magnetic coupler includes a low voltage side chip as the signal input circuit, a high voltage side chip as the signal output circuit, and a transformer as the coupling element.

SUMMARY

A semiconductor device may include: a signal input circuit that may receive a signal from an outside; a signal output circuit that may output the signal to the outside; a coupling element connected between the signal input circuit and the signal output circuit; an inspection output circuit that may cause the signal input circuit to output an inspection signal to the outside not via the coupling element or an inspection input circuit that may cause the signal output circuit to receive the inspection signal from the outside not via the coupling element. The signal input circuit, the signal output circuit, and the coupling element may be formed on a semiconductor chip and packaged.

BRIEF DESCRIPTION OF DRAWINGS

The above and other features and advantages of the present disclosure will become more apparent from the following detailed description made with reference to the accompanying drawings. In the drawings.

DETAILED DESCRIPTION

In a configuration of the comparative example, there is no way of confirming a signal transformer state between the low voltage side chip and the transformer or between the transformer and the high voltage side chip from the outside. Therefore, when a failure occurs, it is difficult to identify which part has the failure from the outside. One example of the present disclosure provides a semiconductor device capable of easily identifying a failure occurrence part from the outside.

According to one example embodiment, a semiconductor device includes: a signal input circuit that receives a signal from an outside; a signal output circuit that outputs the signal to the outside; a coupling element connected between the signal input circuit and the signal output circuit; an inspection output circuit that causes the signal input circuit to output an inspection signal to the outside not via the coupling element or an inspection input circuit that causes the signal output circuit to receive the inspection signal from the outside not via the coupling element. The signal input circuit, the signal output circuit, and the coupling element are formed on a semiconductor chip and packaged.

According to the configuration, when the signal is input to the signal input circuit from the outside, the outside can monitor the signal via the inspection output circuit. When the signal is input to the inspection input circuit from the outside, the outside can monitor the signal via the signal output circuit. Accordingly, even when the semiconductor device is packaged, the outside can confirm whether a function of the signal input circuit or the signal output circuit is normal. According to one example, the coupling element is the transformer, and thereby the present disclosure can be applied to a magnetic coupler.

According to one example, the inspection input circuit has a tri-state output. Therefore, in a case where the signal is transmitted through a normal route from the signal input circuit to the signal output circuit via the coupling element, when the outside controls the output of the inspection input circuit to be in a high impedance state, it may be possible to easily eliminate the influence of the signal output by the inspection input circuit.

First Embodiment

Figure 1:
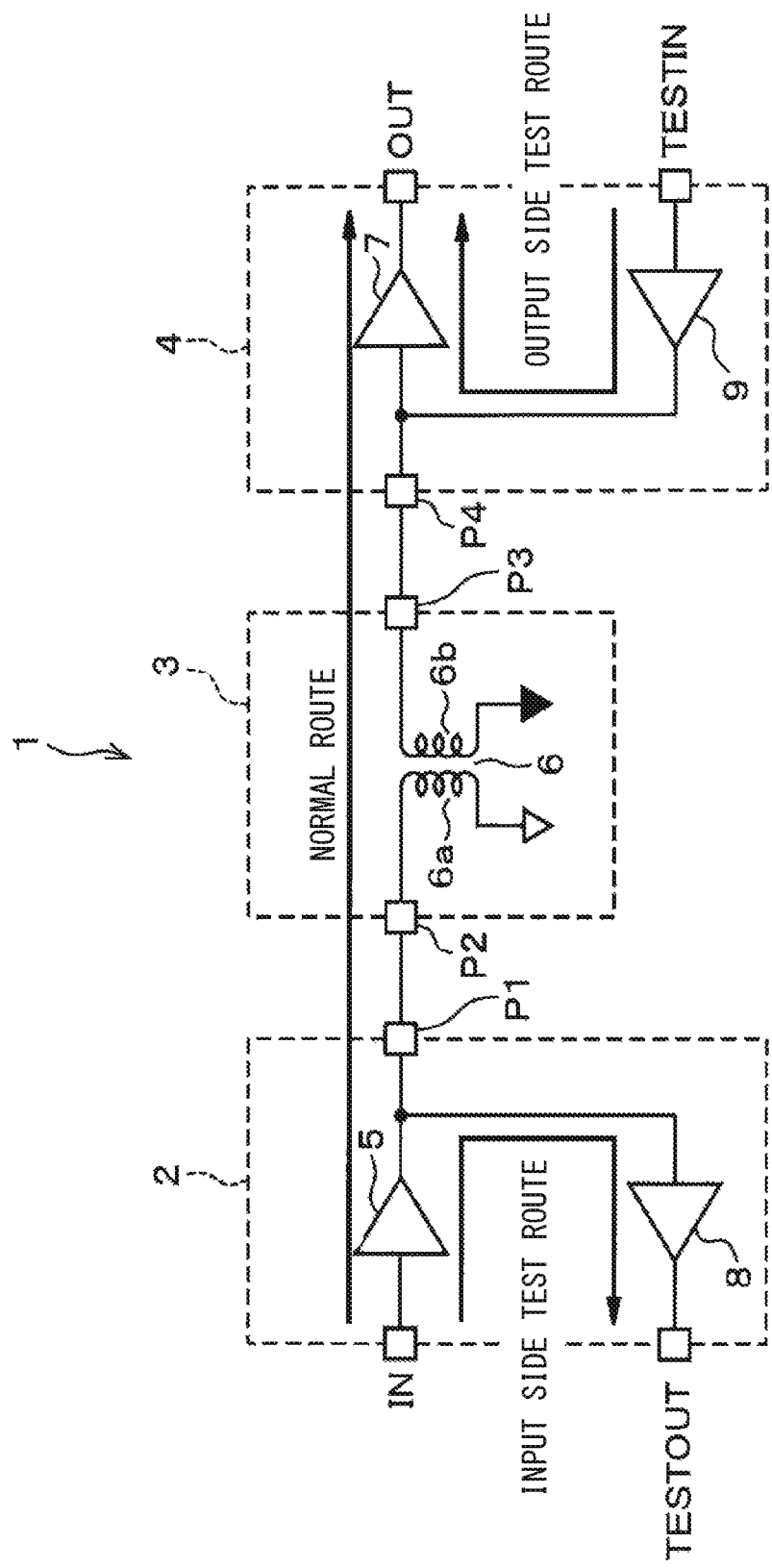
FIG. 1 is a diagram showing a configuration of a magnetic coupler according to a first embodiment.

As shown in FIG. 1, a magnetic coupler 1 as a semiconductor device includes an input side chip 2, a transformer chip 3, and an output side chip 4. The input side chip 2 includes an input buffer 5. A signal is input to an input terminal IN from the outside. The input buffer 5 includes, for example, a non-inversion buffer, and corresponds to a signal input circuit. The transformer chip 3 includes a transformer 6 as a coupling element. An output terminal of the input buffer 5 is connected to a primary side winding 6a of the transformer 6 via pads P1 and P2.

The output side chip 4 includes an output buffer 7. An input terminal of the output buffer 7 is connected to a secondary side winding 6b of the transformer 6 via pads P3 and P4. One ends of the primary side winding 6a and the secondary side winding 6b are connected to independent grounds.

The output buffer 7 includes, for example, a non-inversion buffer, and corresponds to the signal input circuit. An output terminal OUT of the output buffer 7 outputs the signal to the outside. That is, in the magnetic coupler 1, the signal input to the input terminal IN from the outside is transmitted, in an electrically insulated state, to the output side chip 4 via the transformer 6, and is output to the outside via the output terminal OUT. This is shown as a "normal route" in FIG. 1. The magnetic coupler 1 is used, for example, in a route for outputting a gate signal to a gate of a switching element configuring an inverter circuit. At this time, a turn ratio of the transformer 6 is set to, for example, a ratio of 1:1.

In the magnetic coupler 1 of the present embodiment, the input side chip 2 includes an output buffer 8, and the output side chip 4 includes an input buffer 9. These circuits 8 and 9 include, for example, the non-inversion buffer. An input terminal of the output buffer 8 is connected to the output terminal of the input buffer 5. An output terminal of the output buffer 8 is a terminal TESTOUT that outputs a test signal to the outside. An input terminal of the input buffer 9 is a terminal TESTIN that receives the test signal from the outside. An output terminal of the input buffer 9 is connected to the input terminal of the output buffer 7. The output buffer 8 corresponds to the inspection output circuit. The input buffer 9 corresponds to the inspection input circuit.

Figure 2:
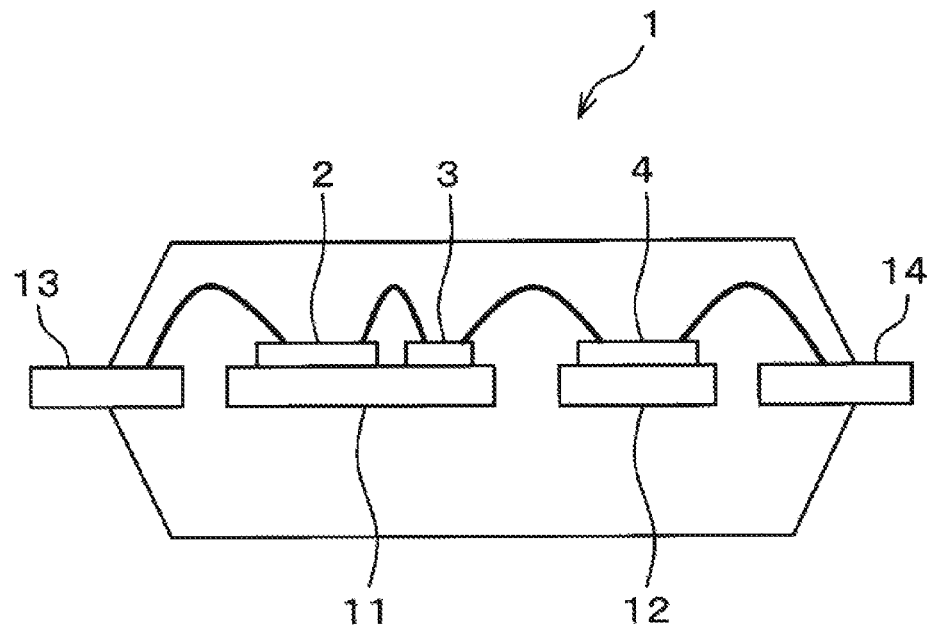
FIG. 2 is a sectional view showing a package of the magnetic coupler.
Figure 3:
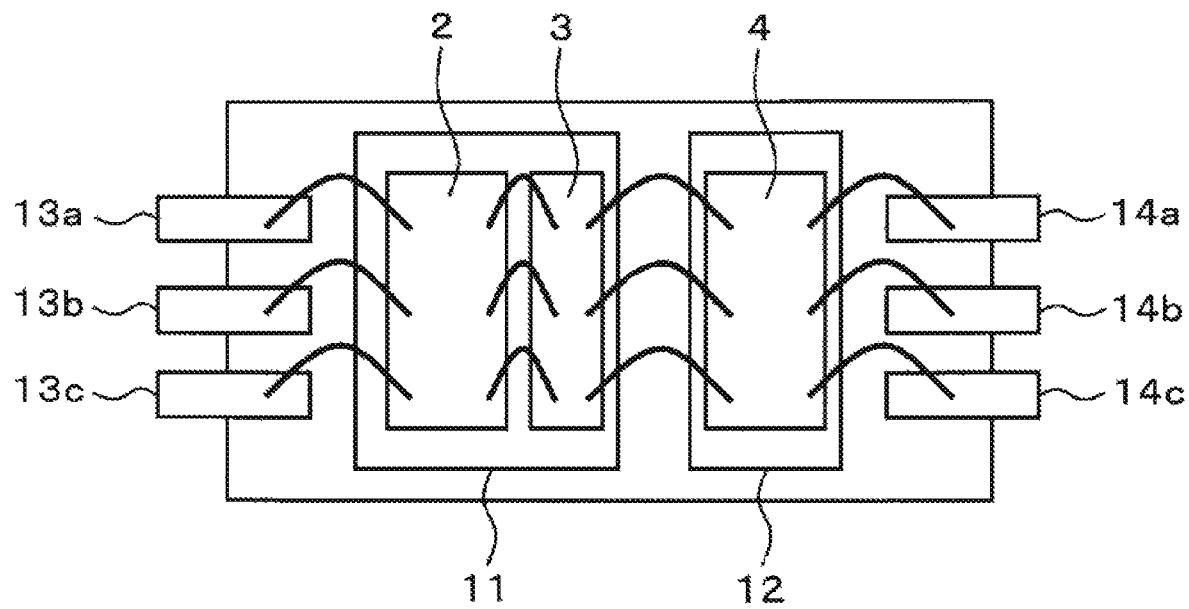
FIG. 3 is a plane view showing an inside of the package of the magnetic coupler.

As shown in FIGS. 2 and 3, for example, both of the input side chip 2 and the transformer chip 3 are die-bonded to a lead frame 11. The output side chip 4 is die-bonded to a lead frame 12. Lead frames 13a to 13c are external terminals close to the input side chip 2. Lead frames 14a to 14c are external terminals close to the output side chip 4. The chips 2 and 3 are connected by a bonding wire. The chips 3 and 4 are connected by the bonding wire. The lead frame 13 and the input side chip 2 are connected by the bonding wire. The output side chip 4 and the lead frame 14 are connected by the bonding wire. The whole is molded by a resin 15. The magnetic coupler 1 is configured by one package.

In the magnetic coupler 1 configured as described above, the signal input to the input terminal IN from the output terminal can be externally monitored via the output terminal TESTOUT. This is shown as an "input side test route" in FIG. 1. Even when the signal is not input to the input terminal IN from the outside, the signal input to the input terminal TESTIN from the outside can be externally monitored via the output terminal OUT. This is shown as an "output side test route" in the drawings. In this way, the outside confirms whether the functions of the input buffer 5 and the output buffer 7 are normal.

In order to prevent the input buffer 9 from driving the input terminal of the output buffer 7 when the "normal route" is used, for example, a switch is placed close to the output of the input buffer 9. When the "normal route" is used, the switch may be turned off.

According to the present embodiment described above, the magnetic coupler 1 includes the transformer 6 connected between the input buffer 5 and the output buffer 7. The input buffer 5, the output buffer 7, the transformer 6 are respectively formed on the input side chip 2, the transformer chip 3, and the output side chip 4 and packaged. The magnetic coupler 1 includes the output buffer 8 for outputting an inspection signal to the outside from the input buffer 5 not via the transformer 6, and the input buffer 9 for inputting the inspection signal to the output buffer 7 from the outside not via the transformer 6.

According to such a configuration, when the signal is input to the input buffer 5 from the outside, the outside can monitor the signal via the output buffer 8. When the signal is input to the input buffer 9 from the outside, the outside can monitor the signal via the output buffer 7. Accordingly, even when the magnetic coupler 1 is packaged, the outside can confirm whether the functions of the input buffer 5 and the output buffer 7 are normal.

Second Embodiment

Figure 4:
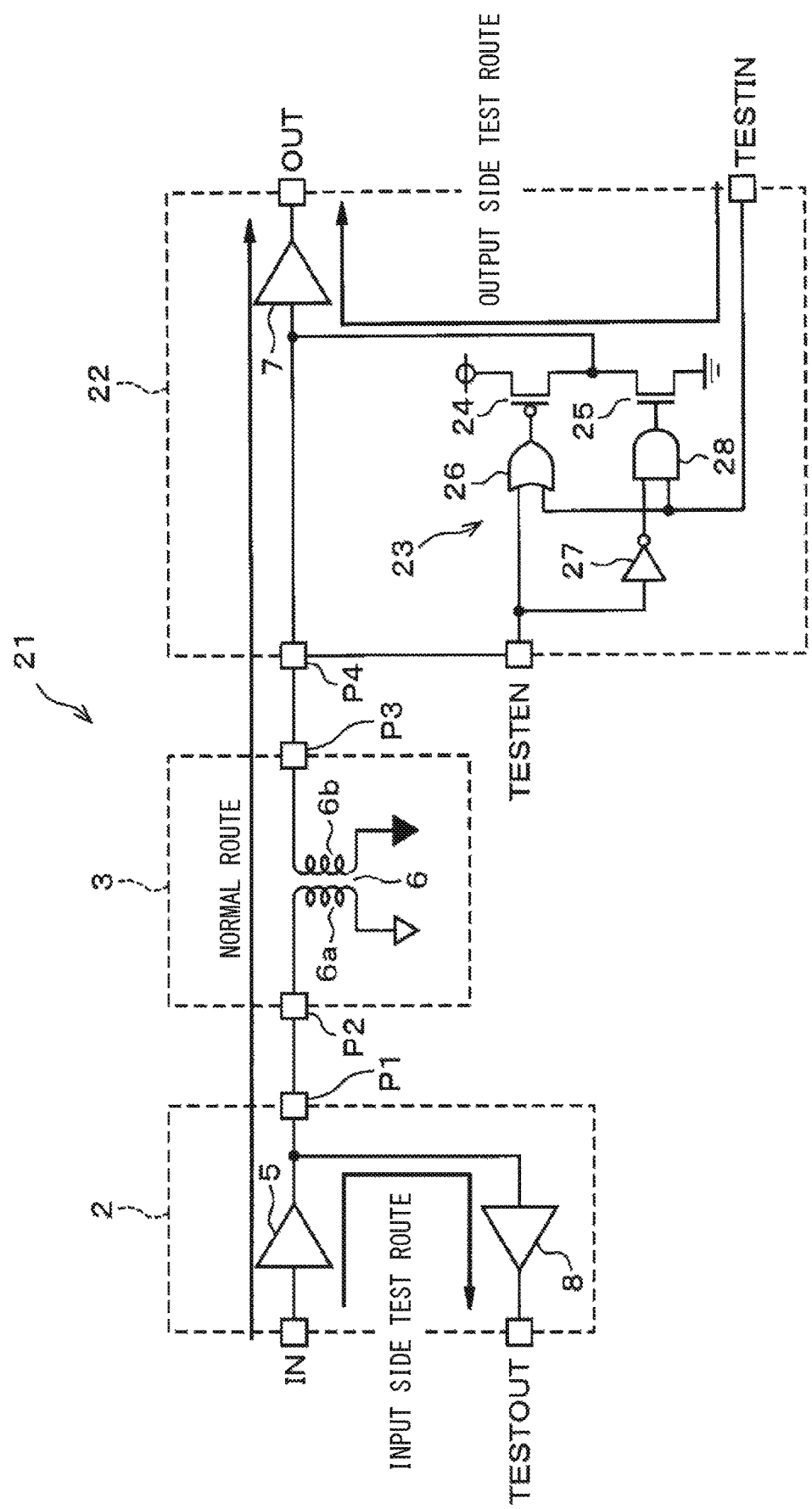
FIG. 4 is a diagram showing a configuration of the magnetic coupler according to a second embodiment.

Hereinafter, the identical parts as those in the first embodiment will be designated by the same reference numerals, and explanations thereof will be omitted. Differences from the first embodiment will be described. As shown in FIG. 4, a magnetic coupler 21 of a second embodiment includes an output side chip 22 instead of the output side chip 4. In the output side chip 22, an inspection input circuit 23 is formed as an inversion buffer of a tri-state output.

The inspection input circuit 23 includes a series circuit of a p-channel MOSFET 24 and an n-channel MOSFET 25 that are connected between the power source and the ground. A symbol of the p-channel MOSFET 24 shows a gate in negative logic. A common connection point of the FETs 24 and 25 is connected to the input terminal of the output buffer 7. An input terminal TESTEN of the output side chip 22 is connected to one side of an input terminal of an OR gate 26 and connected to one side of an AND gate 28 via a NOT gate 27. The input terminal TESTIN is connected to another side of the input terminal of the OR gate 26 and connected to another side of the input terminal of the AND gate 28.

Operation of the second embodiment will be described. When the "normal route" is used, the input terminal TESTEN is set to a high level. The FETs 24 and 25 are turned off. Thereby, the output terminal of the inspection input circuit 23 is in a high impedance state. On the other hand, when the "output side test route" is used, the input terminal TESTEN is set to a low level. The output terminal of the inspection input circuit 23 outputs an inverted level of the binary signal input to the input terminal TESTIN.

As described above, according to the second embodiment, the inspection input circuit 23 of the magnetic coupler 21 has the tri-state output. In the case where the signal is transmitted through the normal route from the input buffer 5 to the output buffer 7 via the transformer 6, when the output of the inspection input circuit 23 is controlled to be in the high impedance state, it may be possible to easily eliminate the influence of the signal output from the corresponding circuit 23.

Third Embodiment

Figure 5:
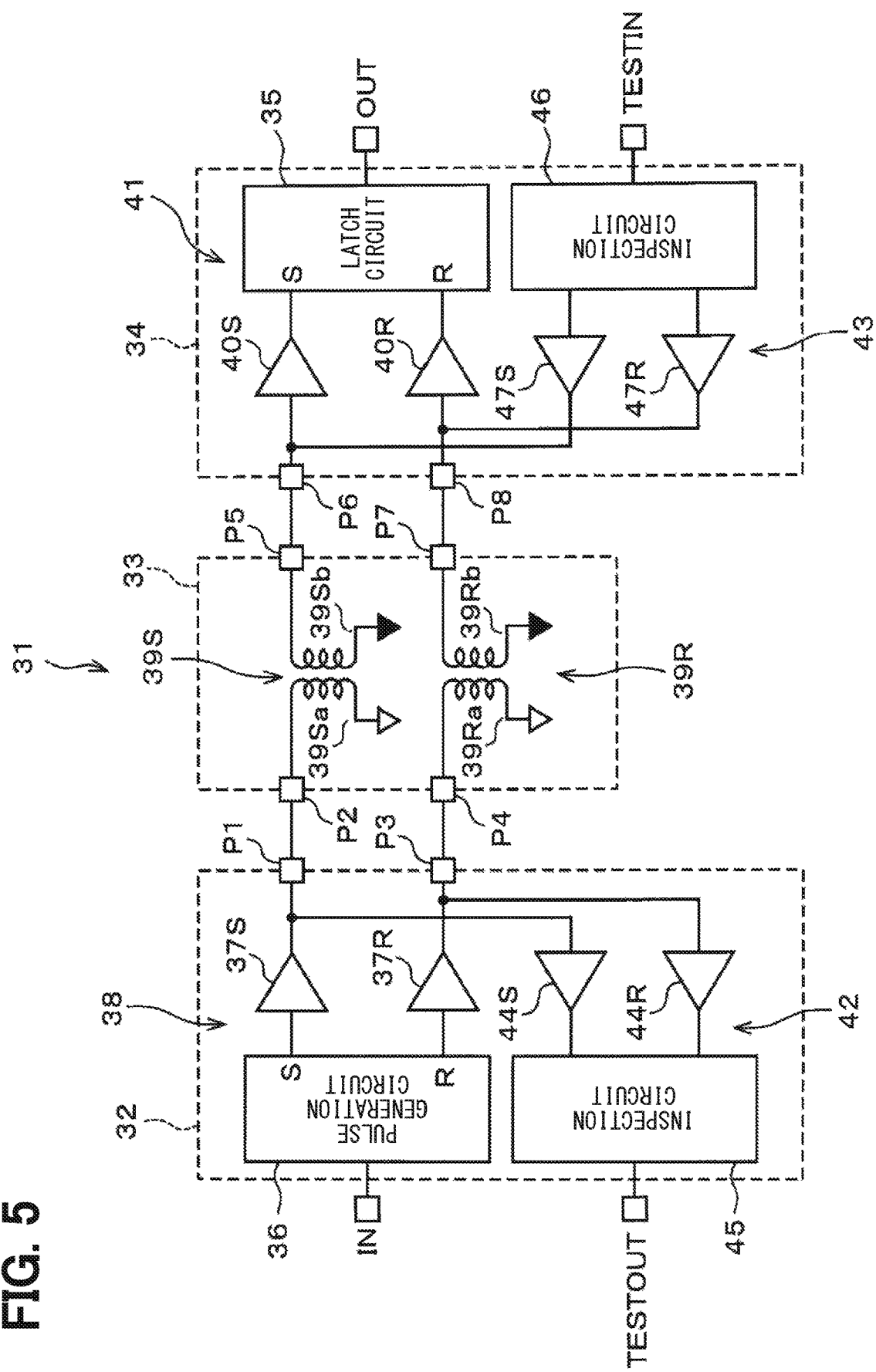
FIG. 5 is a diagram showing a configuration of the magnetic coupler according to a third embodiment.

As shown in FIG. 5, a magnetic coupler 31 of a third embodiment includes an input side chip 32, a transformer chip 33, and an output side chip 34. The output side chip 34 includes a latch circuit 35 that is a RS flip-flop. The input side chip 32 includes a pulse generation circuit 36 for inputting a set signal and a reset signal to the latch circuit 35.

The pulse generation circuit 36 includes output terminals S and R. When a signal level of an input signal IN becomes high, the output terminal S becomes high level, and the output terminal R becomes low level. On the other hand, when the signal level becomes low, the output terminal S becomes low level, and the output terminal R becomes high level. The set signal is output to the transformer chip 33 via an output buffer 37S, the pad P1, and the pad P2. The reset signal is output to the transformer chip 33 via an output buffer 37R, the pad P3, and the pad P4. The pulse generation circuit 36 and the output buffer 37 configure a signal input circuit 38.

The transformer chip 33 includes transformers 39S and 39R with respect to signals of two systems. One end of a primary side winding 39Sa of the transformer 39S is connected to the pad P2. One end of a secondary side winding 39Sb is connected to a pad P5. One end of a primary side winding 39Ra of the transformer 39R is connected to the pad 4. One end of a secondary side winding 39Rb is connected to a pad P7.

The pad P5 of the transformer chip 33 is connected to a pad P6 of the output side chip 34. The pad 7 is connected to the pad 8 of the output side chip 34. The pad 6 is connected to an input terminal S of the latch circuit 35 via an input buffer 40S. The pad 8 is connected to an input terminal R of the latch circuit 35 via an input buffer 40R. The latch circuit 35 and the input buffer 40 configure a signal output circuit 41.

In the configuration described above, the set signal output by the pulse generation circuit 36 is input to the input terminal S of the latch circuit 35 via the output buffer 37S, the pads P1 and P2, the transformer 39S, the pads P5 and P6, and the input buffer 40S. The reset signal output by the pulse generation circuit 36 is input to the input terminal R of the latch circuit 35 via the output buffer 37R, the pads P3 and P4, the transformer 39R, the pads P5 and P6, and the input buffer 40S.

The input side chip 32 includes an inspection output circuit 42 in accordance with the signal input circuit 38. The output side chip 34 includes an inspection output circuit 43 in accordance with a signal output circuit 41. The inspection output circuit 42 includes output buffers 44S and 44R and an inspection circuit 45. The input terminals of the output buffers 44S and 44R are respectively connected to the output terminals of the output buffers 37S and 37R. The output terminals of the output buffers 44S and 44R are respectively connected to the input terminals of the inspection circuit 45. The output terminal of the inspection circuit 45 is connected to the output terminal TESTOUT of the input side chip 32.

The inspection input circuit 43 includes an inspection circuit 46 and input buffers 47S and 47R. An input terminal of the inspection circuit 46 is connected to the input terminal TESTIN of the output side chip 34. Two output terminals of the inspection circuit 46 are respectively connected to input terminals of the input buffers 47S and 47R. The output terminals of the input buffers 47S and 47R are respectively connected to input terminals of the output buffers 40S and 40R. The configuration of the inspection circuit 46 is same as the configuration of the pulse generation circuit 36.

Although the input buffers 47S and 47R are the tri-state output similarly to the second embodiment or a switch for disconnecting the output terminals is placed, these are omitted to be shown in the drawings. This also applies to the following embodiments.

Next, operation of the present embodiment will be described. The inspection circuit 45 includes, for example, the OR gate. When the signal level input to the input terminal IN is high, the set signal is output to the latch circuit 35 via the transformer chip 33, and the level of the output terminal OUT becomes high. The set signal is output from the output terminal TESTOUT via the input buffer 44S and the inspection circuit 45.

On the other hand, when the signal level input to the input terminal IN is low, the reset signal is output to the latch circuit 35 via the transformer chip 33, and the level of the output terminal OUT becomes low. Similarly, the reset signal is output from the output terminal TESTOUT via the input buffer 44R and the inspection circuit 45. In this way, the outside can confirm whether the function of the pulse generation circuit 36 is normal.

When the signal level input to the input terminal TESTIN is high, the set signal is output to the latch circuit 35 via the inspection circuit 46 and the input buffer 47S, and the level of the output terminal OUT becomes high. On the other hand, when the signal level input to the input terminal TESTIN is low, the reset signal is output to the latch circuit 35 via the inspection circuit 46 and the input buffer 47R, and the level of the output terminal OUT becomes low. In this way, the outside can confirm whether the function of the pulse generation circuit 36 is normal. As described above, according to the third embodiment, even in the case of the magnetic coupler 31 that transmits the two types of signals, the outside can confirm whether the internal function is normal.

Fourth to Sixth Embodiments

Figure 6:
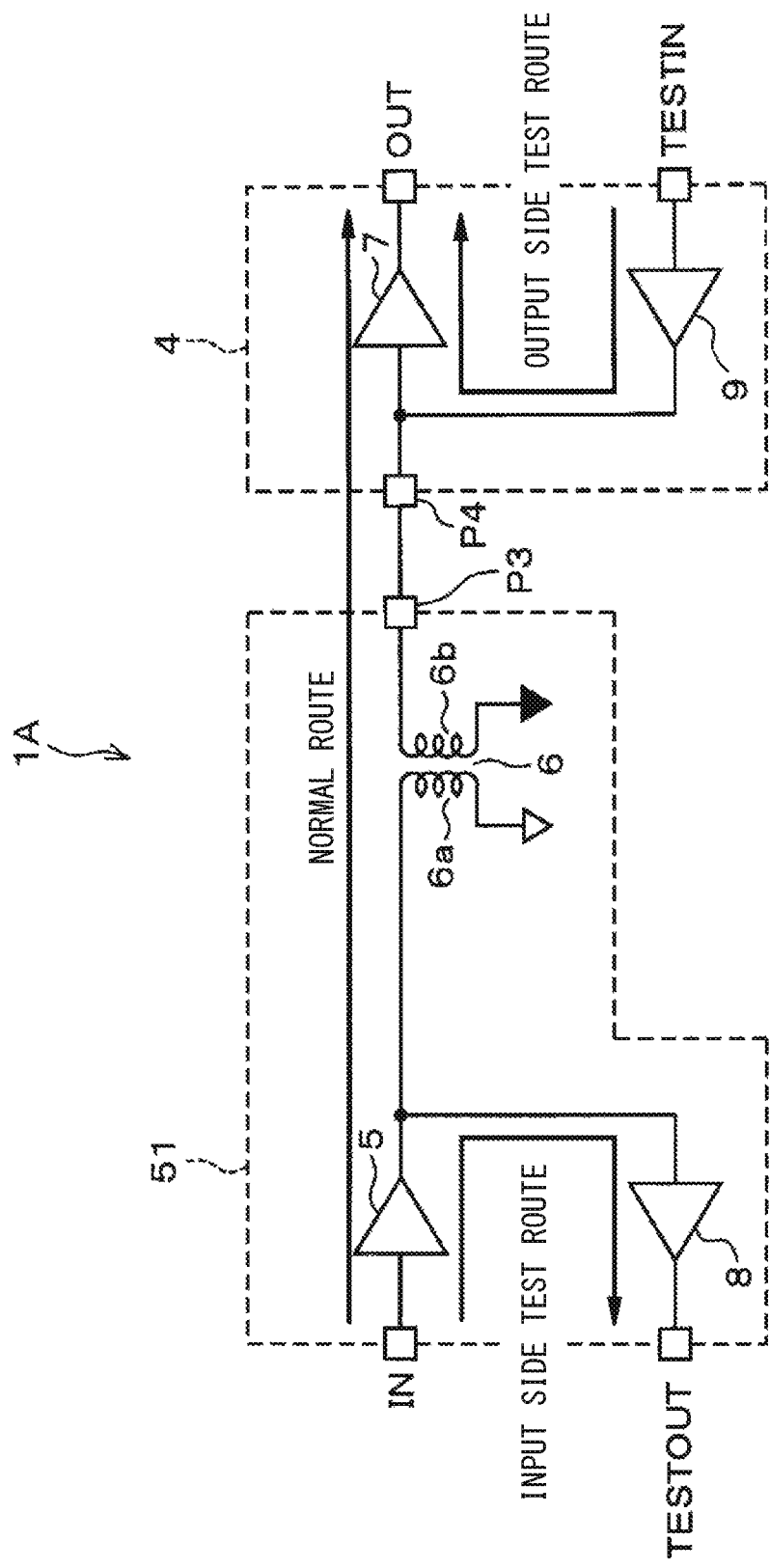
FIG. 6 is a diagram showing a configuration of the magnetic coupler according to a fourth embodiment.
Figure 7:
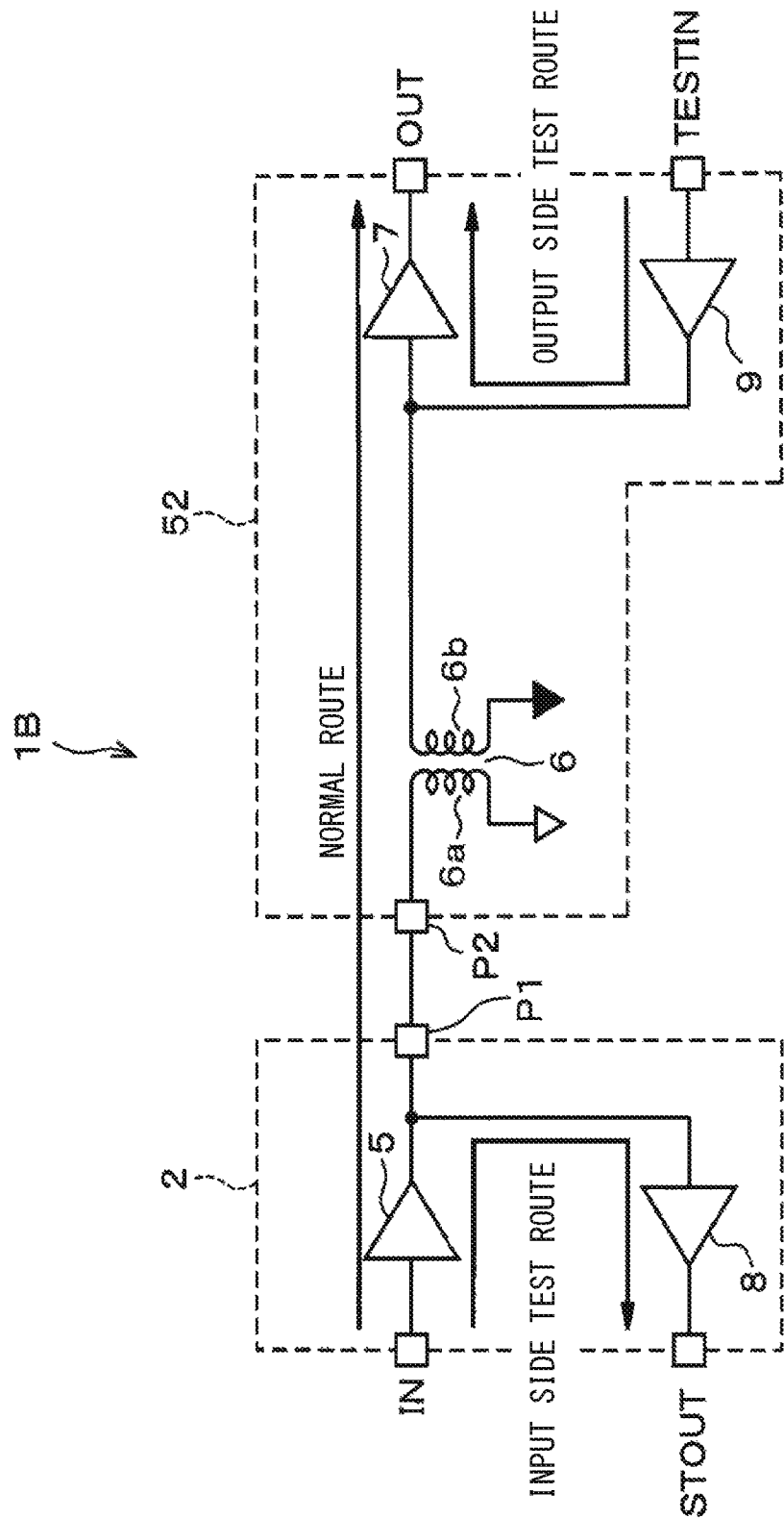
FIG. 7 is a diagram showing a configuration of the magnetic coupler according to a fifth embodiment.
Figure 8:
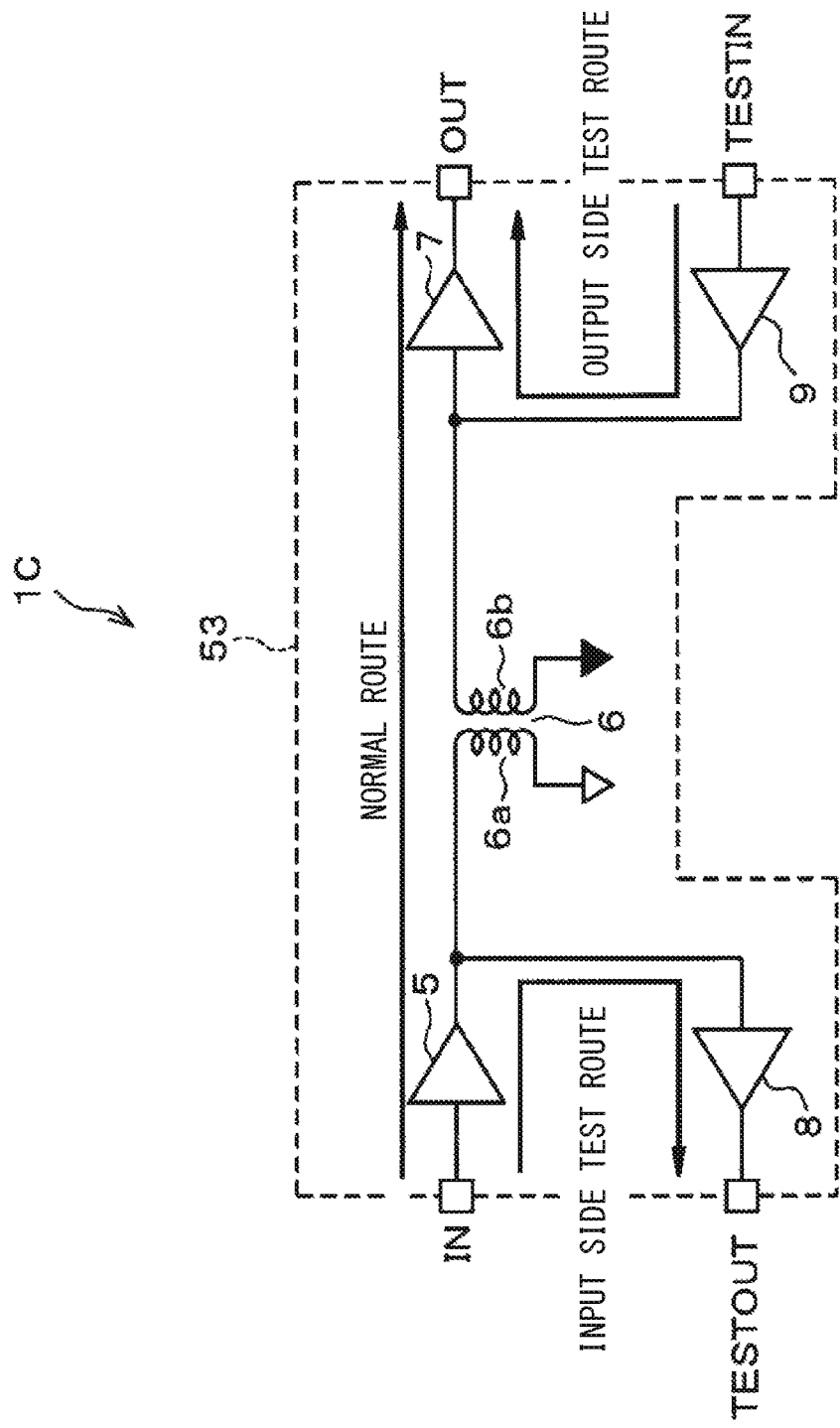
FIG. 8 is a diagram showing a configuration of the magnetic coupler according to a sixth embodiment.

Magnetic couplers 1A to 1C of fourth to sixth embodiments shown in FIGS. 6 to 8 are functionally same as the magnetic coupler 1 of the first embodiment and are different only in a configuration of a semiconductor chip. In the magnetic coupler 1A of the fourth embodiment shown in FIG. 6, an input side chip 51 includes the transformer 6 with the input buffer 5 and the output buffer 8. In the magnetic coupler 1B of the fifth embodiment shown in FIG. 7, a output side chip 52 includes the transformer 6 with the output buffer 7 and the input buffer 9. In the magnetic coupler 1C of the sixth embodiment shown in FIG. 8, one semiconductor chip 53 includes all of the circuits and the elements.

Seventh Embodiment

Figure 9:
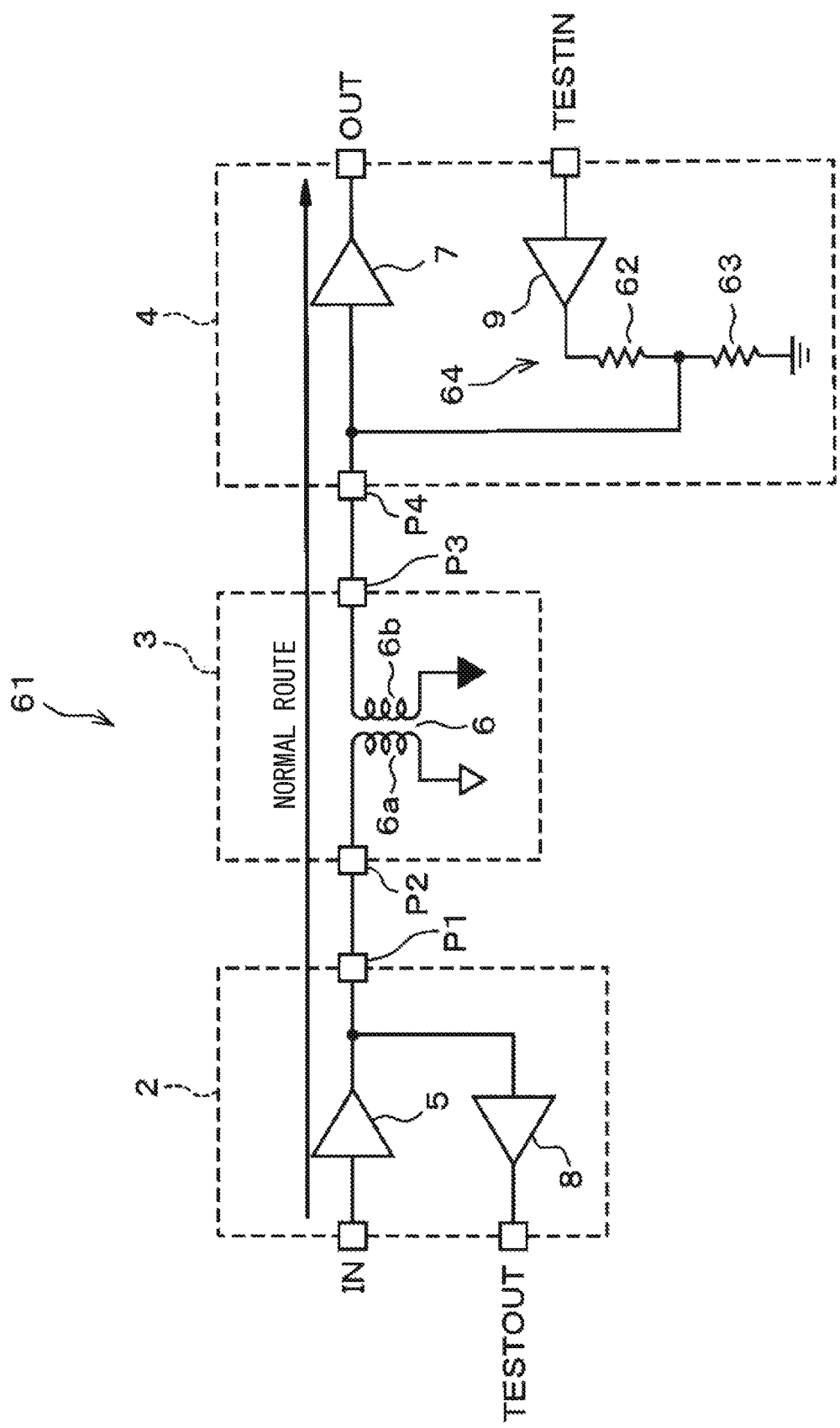
FIG. 9 is a diagram showing a configuration of the magnetic coupler according to a seventh embodiment.

In a magnetic coupler 61 of a seventh embodiment shown in FIG. 9, a series circuit of resistance elements 62 and 63 is connected between the output terminal of the input buffer 9 of the magnetic coupler 1 of the first embodiment and the ground. A common connection point of the resistance elements 62 and 63 is connected to the input terminal of the output buffer 7. These configure an inspection input circuit 64. According to the magnetic coupler 61 configured as described above, the high level signal different from a power supply voltage level supplied to the buffers 7 and 9 can be applied to the input terminal of the output buffer 7.

Eighth Embodiment

Figure 10:
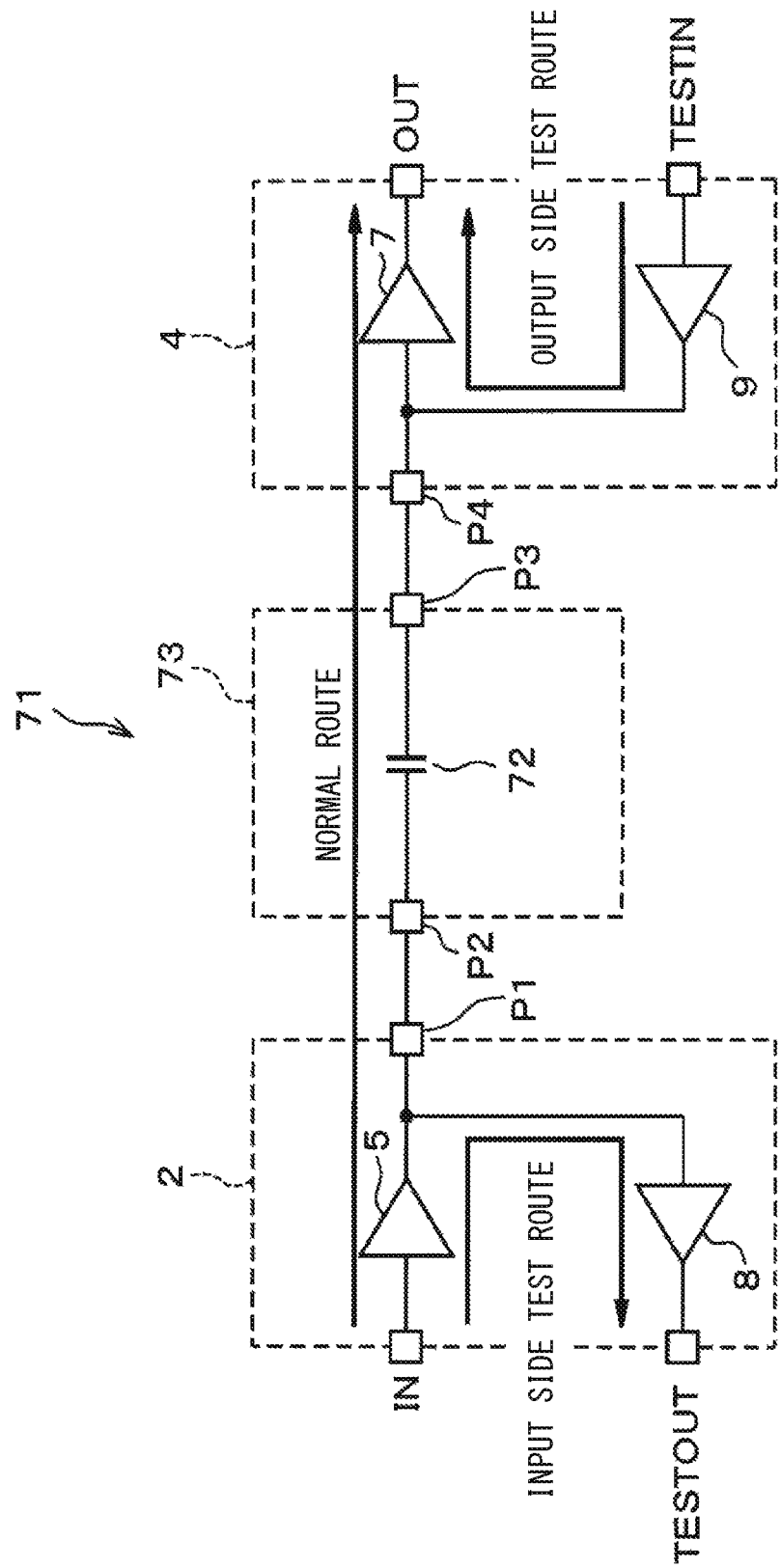
FIG. 10 is a diagram showing a configuration of the magnetic coupler according to an eighth embodiment.

An eighth embodiment shown in FIG. 10 is a capacitance coupler 71. The capacitance coupler 71 includes a capacitor chip 73 that includes a capacitor 72 as the coupling element instead of the transformer chip 3. In the capacitance coupler 71, the signal input to the input side chip 2 is transmitted to the output side chip 4 by capacitance coupling.

Ninth Embodiment

Figure 11:
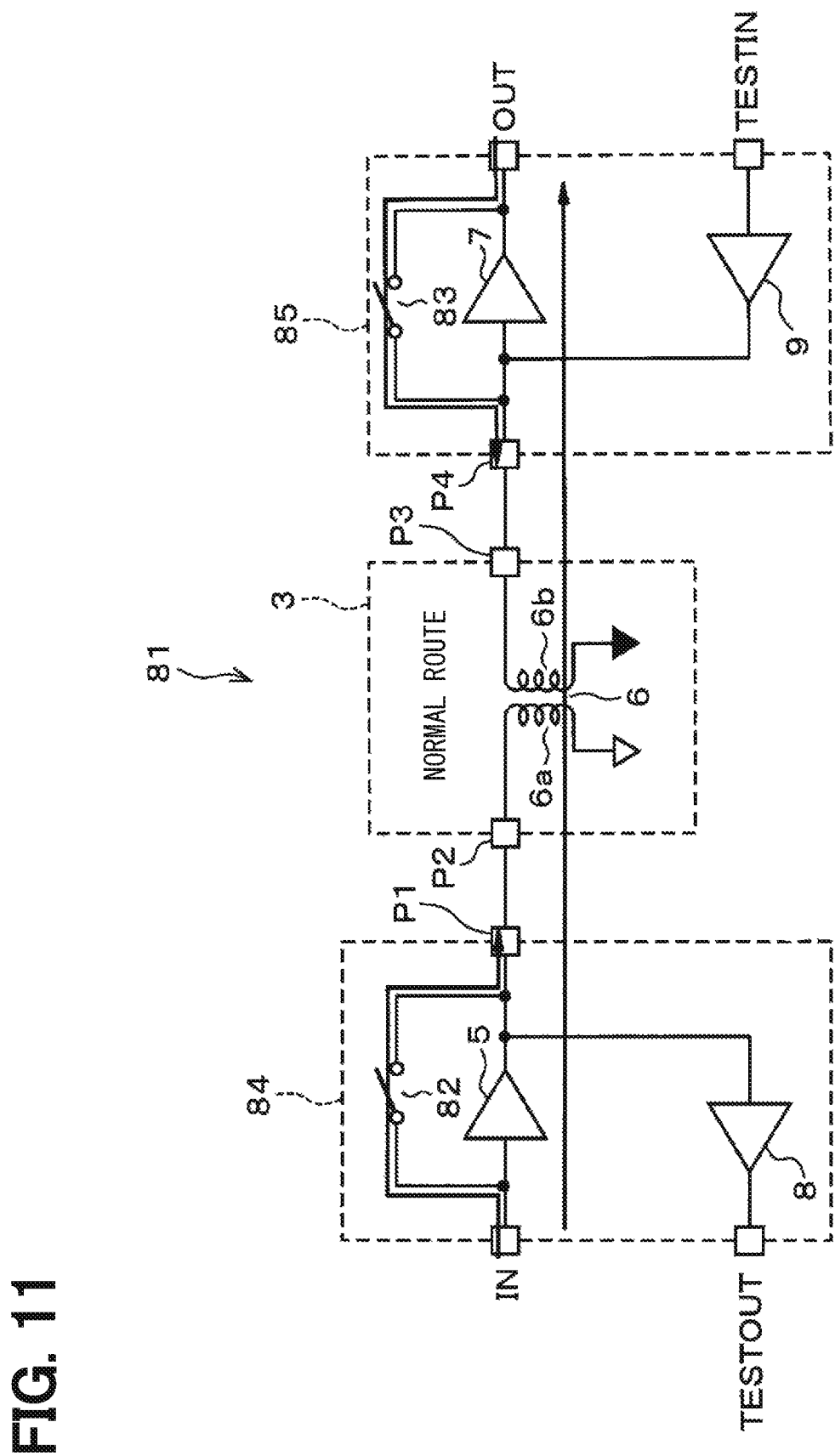
FIG. 11 is a diagram showing a configuration of the magnetic coupler according to a ninth embodiment.

In a magnetic coupler 81 of a ninth embodiment shown in FIG. 11, a switch circuit 82 is connected in parallel to the input buffer 5, and a switch circuit 83 is connected in parallel to the output buffer 7. The switch circuit 82 may be also referred to as a transmission side switch. The switch circuit 83 may be also referred to as a reception side switch. Correspondingly, a terminal for controlling an on-off state of each of the switch circuits 82 and 83 is placed in an input side chip 84 and an output side chip 85 (not shown). According to the magnetic coupler 81 configured as described above, the outside can confirm whether the transformer 6 is normal by turning on the switch circuits 82 and 83 to short-circuit the buffers 5 and 7.

Tenth Embodiment

Figure 12:
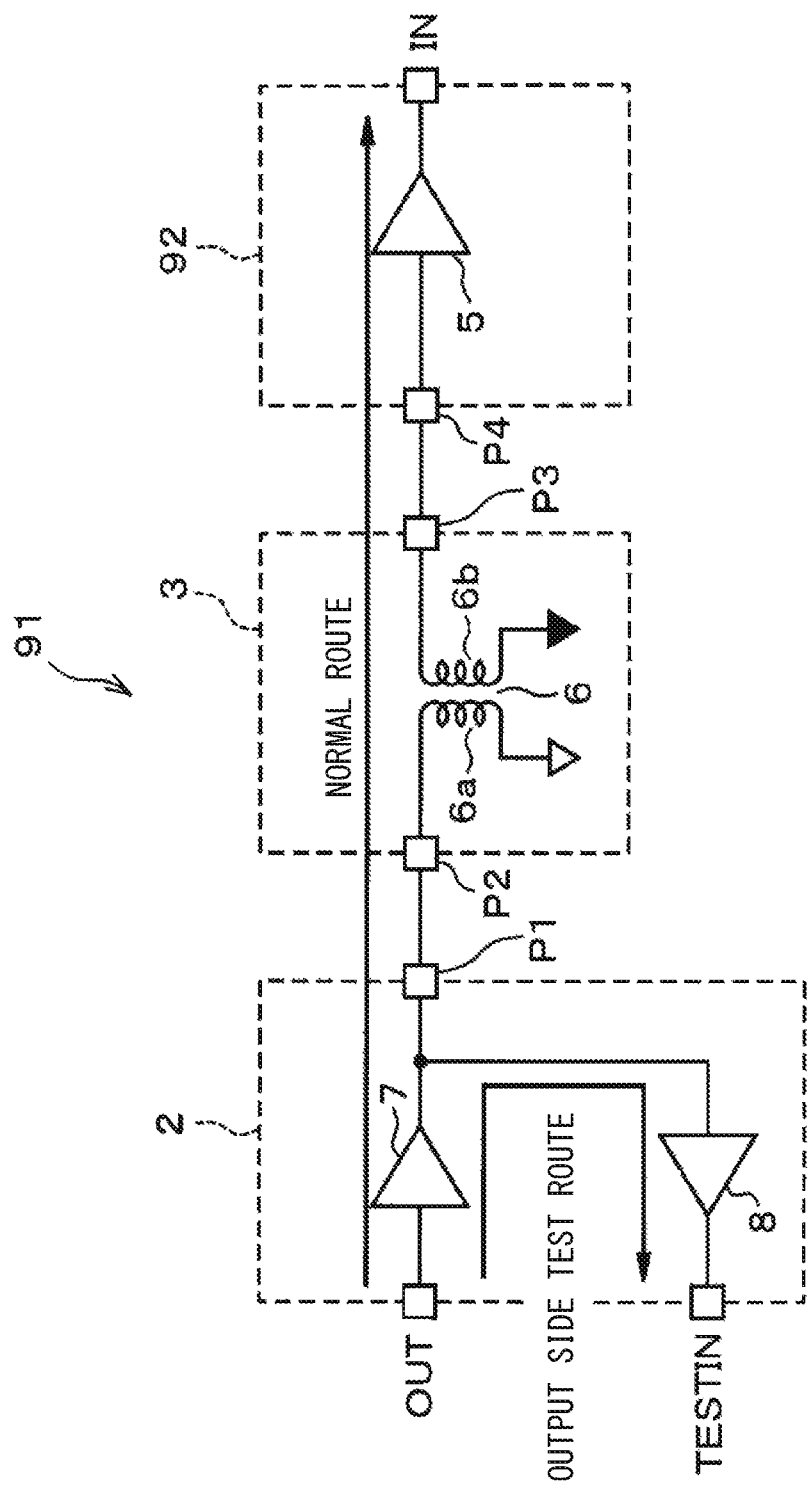
FIG. 12 is a diagram showing a configuration of the magnetic coupler according to a tenth embodiment.

In a magnetic coupler 91 of a tenth embodiment shown in FIG. 12, a semiconductor chip 92 is obtained by removing the input buffer 9 from the output side chip 4.

Eleventh Embodiment

Figure 13:
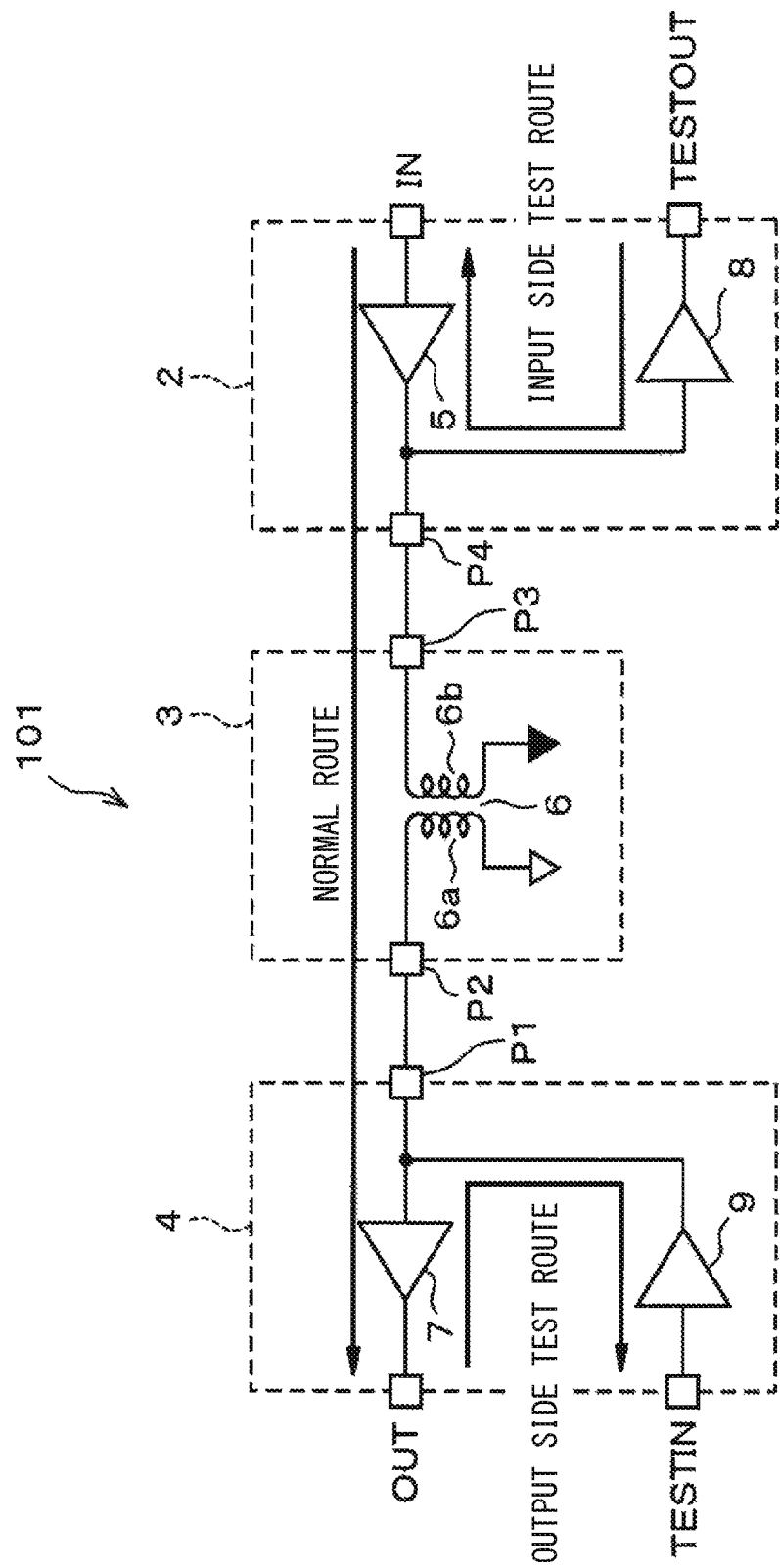
FIG. 13 is a diagram showing a configuration of the magnetic coupler according to an eleventh embodiment.

In a magnetic coupler 101 of an eleventh embodiment shown in FIG. 13, the input side chip 2 is connected to the secondary side of the transformer chip 3, and the output side chip 4 is connected to the primary side.

Other Embodiments

The input buffer 9 may be removed from the magnetic coupler 1 of the first embodiment. The turn ratio of the transformer is not limited to a ratio of 1:1. The output buffer 8 may be placed in a semiconductor chip different from a semiconductor chip that includes the input buffer 5. The input buffer 9 may be placed in a semiconductor chip different from a semiconductor chip that includes the output buffer 7. The switch circuits 82 is placed in a semiconductor chip different from a semiconductor chip that includes the input buffer 5. The switch circuit 83 is placed in a semiconductor chip different from a semiconductor chip that includes the output buffer 7.

The circuit mounted on the signal input circuit and the signal output circuit may be appropriately changed in accordance with the individual design. It is unnecessary to mold all the semiconductor chips into a single package. Each of the semiconductor chips may be molded into an individual package or may be molded into any two common packages. A photo coupler may be employed as the coupling element.

Although the present disclosure has been described in accordance with the embodiments, it is understood that the present disclosure is not limited to such embodiments and configurations. The present disclosure covers various modification examples and equivalent arrangements. In addition, various combinations and forms, and further, other combinations and forms including only one element, or more or less than these elements are also within the sprit and the scope of the present disclosure.

The invention claimed is:

1. A semiconductor device comprising:
   a signal input circuit configured to receive a signal from an outside;
   a signal output circuit configured to output the signal to the outside;
   a coupling element connected between the signal input circuit and the signal output circuit; and
   at least one of an inspection output circuit configured to cause the signal input circuit to output an inspection signal to the outside not via the coupling element or an inspection input circuit configured to cause the signal output circuit to receive the inspection signal from the outside not via the coupling element,
   wherein:
   the signal input circuit, the signal output circuit, and the coupling element are formed on a semiconductor chip and packaged; and
   the inspection input circuit has a tri-state output.

2. The semiconductor device according to claim 1, wherein:
   the coupling element corresponds to a transformer.

3. The semiconductor device according to claim 1, wherein:
   at least two of the signal input circuit, the signal output circuit, or the coupling element are formed in an identical semiconductor chip.

4. The semiconductor device according to claim 3, wherein:
   at least two of the coupling element, the signal input circuit, or the signal output circuit are molded into a single package.

5. The semiconductor device according to claim 1, wherein:
   the inspection output circuit is formed in an identical semiconductor chip with the signal input circuit or the inspection input circuit is formed in an identical semiconductor chip with the signal output circuit.

6. The semiconductor device according to claim 1, wherein:
   the coupling element transmits the signal input, in an electrically insulated state, to the signal output circuit via the signal input circuit.

7. A semiconductor device comprising:
   a signal input circuit configured to receive a signal from an outside;
   a signal output circuit configured to output the signal to the outside;
   a coupling element connected between the signal input circuit and the signal output circuit; and
   at least one of an inspection output circuit configured to cause the signal input circuit to output an inspection signal to the outside not via the coupling element or an inspection input circuit configured to cause the signal output circuit to receive the inspection signal from the outside not via the coupling element,
   wherein:
   the signal input circuit, the signal output circuit, and the coupling element are formed on a semiconductor chip and packaged; and
   the inspection input circuit is configured to output a high level signal different from a power supply voltage supplied to the signal output circuit.

8. A semiconductor device comprising:
   a signal input circuit configured to receive a signal from an outside;
   a signal output circuit configured to output the signal to the outside;
   a coupling element connected between the signal input circuit and the signal output circuit;
   at least one of an inspection output circuit configured to cause the signal input circuit to output an inspection signal to the outside not via the coupling element or an inspection input circuit configured to cause the signal output circuit to receive the inspection signal from the outside not via the coupling element; and
   at least one of a transmission side switch configured to bypass the signal input to the signal input circuit and output the signal to the coupling element or a reception side switch configured to bypass the signal input to the signal output circuit and output the signal to the outside, wherein:

the signal input circuit, the signal output circuit, and the coupling element are formed on a semiconductor chip and packaged.

9. The semiconductor device according to claim 8, wherein:

the at least one of the transmission side switch or the reception side switch is formed on the semiconductor chip.

10. A semiconductor device comprising:

a signal input circuit configured to receive a signal from an outside;

a signal output circuit configured to output the signal to the outside;

a coupling element connected between the signal input circuit and the signal output circuit; and at least one of an inspection output circuit configured to cause the signal input circuit to output an inspection signal to the outside not via the coupling element or an inspection input circuit configured to cause the signal output circuit to receive the inspection signal from the outside not via the coupling element, wherein:

the signal input circuit, the signal output circuit, and the coupling element are formed on a semiconductor chip and packaged;

the signal input circuit, the signal output circuit, and the coupling element are respectively formed in different semiconductor chips; and the signal input circuit, the signal output circuit, and the coupling element are respectively molded into different packages.

\* \* \* \* \*